(12) United States Patent
Dengi et al.

(10) Patent No.: US 7,539,961 B2
(45) Date of Patent: May 26, 2009

(54) LIBRARY-BASED SOLVER FOR MODELING AN INTEGRATED CIRCUIT

(75) Inventors: Enis Aykut Dengi, Tempe, AZ (US); Feng Ling, Gilbert, AZ (US); Ben Song, McLean, VA (US); Warren Harris, Glendale, AZ (US)

(73) Assignee: Cadence Design Systems, Inc., San Jose, CA (US)

( * ) Notice: Subject to any disclaimer, the term of this patent is extended or adjusted under 35 U.S.C. 154(b) by 231 days.

(21) Appl. No.: 11/601,573

(22) Filed: Nov. 17, 2006

(65) Prior Publication Data

US 2008/0120083 A1 May 22, 2008

(51) Int. Cl.
G06F 17/50 (2006.01)
G06F 19/00 (2006.01)
(52) U.S. Cl. .................... 716/5; 716/8; 716/12; 703/16
(58) Field of Classification Search .................... 716/5, 716/8, 12; 703/16
See application file for complete search history.

(56) References Cited

U.S. PATENT DOCUMENTS

2005/0076317 A1   4/2005  Ling et al.
2007/0067747 A1*  3/2007  Checka et al. .................. 716/5
2008/0120084 A1*  5/2008  Dengi et al. ................... 703/14

OTHER PUBLICATIONS

F. Ling, V. I. Okhmatovski, W. Harris, S. McCracken and A. Dengi, "Large-Scale Broad-Band Parasitic Extraction for Fast Layout Verification of 3-D RF and Mixed-Signal On-Chip Structures", IEEE Transactions on Microwave Theory and Techniques, vol. 53, No. 1, pp. 264-273, Jan. 2005.

V.I. Okhmatovski, J. Morsey and A.C. Cangellaris, "On Deembedding of Port Discontinuities in Full-Wave CAD Models of Multiport Circuits," IEEE Transactions on Microwave Theory and Techniques, vol. 51, No. 12, pp. 2355-2365, Dec. 2003.

V. Rokhlin, "Rapid Solution of Integral Equations of Classical Potential Theory," Journal of Computational Physics, vol. 60, pp. 187-207, 1983.

S. Chakraborty, V. Jandhyala, "A Surface Equivalence-Based Method to Enable Rapid Design and Layout Iterations of Coupled Electromagnetic Components in Integrated Packages," The 13th Topical Meeting on Electrical Performance of Electronic Packaging, pp. 45-48, 2004.

E. A. Dengi, "A Parasitic Capacitance Extraction Method for VLSI Interconnect Modeling," Phd thesis, Carnegie Mellon University, Feb. 1997.

U.S. Appl. No. 11/601,601, filed Nov. 17, 2006 to inventors Dengi, et al. titled "Incremental Solver for Modeling an Integrated Circuit."

* cited by examiner

*Primary Examiner*—Phallaka Kik
(74) *Attorney, Agent, or Firm*—Robert E. Scheid; Duane Morris LLP

(57) ABSTRACT

A system and method for modeling an IC (integrated circuit) employs a mesh model and a grid model for separating impedance effects between nearby and far-away pairs of mesh elements. Models for relating currents and voltages can be incrementally adapted from other designs or design elements in applications including mixed-signal, analog and RF (radio frequency) circuits.

24 Claims, 10 Drawing Sheets

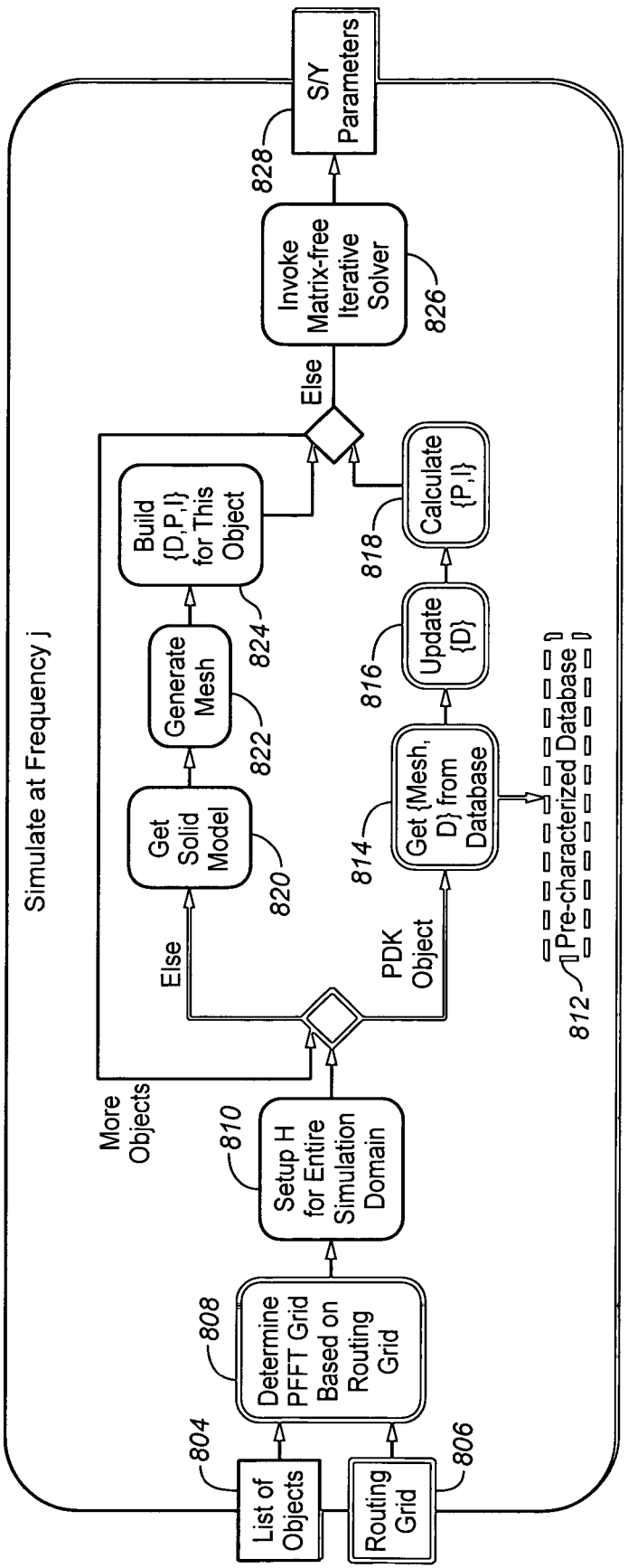

LIBRARY-BASED SOLVER FOR MODELING AN INTEGRATED CIRCUIT

BACKGROUND OF THE INVENTION

1. Field of Invention

The present invention relates to integrated circuits and more particularly to modeling current and voltage relationships in integrated circuits.

2. Description of Related Art

Parasitic extraction has been an important part of integrated circuit (IC) design verification for at least a decade, and the sophistication of the extraction process has increased over this time. In general, these parasitic effects are undesired component interactions that result from increasingly compact and complex circuit designs, and their modeling (or extraction) has become increasingly important for verifying designs.

The assumption that devices themselves did not interact with one another and could be modeled by their compact models remained valid until relatively recently. However, the interaction between devices via the substrate has turned out to be critical to the performance of especially mixed-signal, analog and RF (radio frequency) circuits. Early parasitic extraction programs aimed to capture layout-dependent device parameters such as diffusion area and perimeter. As frequencies increased, interconnect parasitic capacitance, then resistance, then inductance were added to the models. Additionally, coupling capacitances and later mutual inductances between wires were added to the list of parasitic effects being captured to identify signal integrity problems in digital designs.

Recently, substrate extractors have been used to extract a resistor-capacitor network for the substrate. However, RF integrated circuits have been particularly problematic for extraction methodologies due to the use of embedded passive elements. Spiral inductors and metal-insulator-metal (MIM) capacitors are key to implementing RF functionality. However, these elements tend to interact among each other as well as with surrounding interconnect elements. In order to resolve these effects, IC modelers have developed quasi-static electromagnetic solvers that treat passive elements, such as inductors and MIM capacitors, as metal and models the entire metal structure together with the lossy substrate.

More recently, electromagnetic solvers (e.g., Virtuoso RF Designer Solver) have offered the same capability in fullwave (e.g., complete solutions to Maxwell's equations). See, for example, U.S. Patent Application Publication No. 2005/0076317 A1, "Method and apparatus for determining interactive electromagnetic effects among conductors of a multilayer circuit" (Apr. 7, 2005), and "Large-scale Broad-band Parasitic Extraction for Fast Layout Verification of 3-D RF and Mixed-Signals On-chip Structures", F. Ling et al., IEEE Transactions on Microwave Theory and Techniques, Vol. 53, No. 1, January 2005.

However, these fullwave solutions are generally computationally intensive and take a significant amount of time because of the large size of the corresponding matrices. Furthermore, it is generally difficult for IC designers to assess the effect of a relatively small incremental change in a design without a substantially redoing the calculations for the fullwave solution. As a result, these solvers are often used more as verification tools rather than design tools.

Therefore there is an need for IC modeling tools for determining accurate (e.g., fullwave) solutions that can be flexibly used when designs are incrementally adapted from other designs or design elements.

SUMMARY OF THE INVENTION

In one embodiment of the present invention, a method for modeling an integrated circuit (IC) includes: specifying a first layout for the integrated circuit, wherein the first layout includes a plurality of devices and a specification of parameters, placement and routing for the devices; specifying a second layout for the integrated circuit by changing placement of at least one device in the specification of the first layout; approximating an operating point for the first layout by separating a plurality of first-layout voltage values into nearby components and far-away components; approximating an operating point for the second layout that corresponds to the operating point of the first layout by separating a plurality of second-layout voltage values into nearby components and far-away components, wherein nearby components of the first-layout voltage values and the second-layout voltage values are calculated from equivalent matrix operations on corresponding first-layout current values and second-layout current values, and far-away components of the first-layout voltage values and the second-layout voltage values are calculated from equivalent matrix operations on corresponding first-layout current values and second-layout current values including a shifting of values corresponding to differences between the first layout and the second layout; and saving at least some values for the integrated circuit (e.g., in an computer-readable medium).

According to one aspect of this embodiment, the method may further include: specifying a mesh for modeling the integrated circuit, the mesh including a plurality of mesh elements for defining values on the mesh, wherein approximating the nearby components of the first-layout voltage values includes calculating a basis-function expansion for modeling an electromagnetic field across the integrated circuit by a first summation of basis functions that are defined across mesh elements by polynomial interpolations of corresponding mesh-element values, and approximating the nearby components of the second-layout voltage values includes calculating a basis-function expansion for modeling an electromagnetic field across the integrated circuit by a second summation of the basis functions.

Additionally, with respect to this aspect, the method may further include: for at least some mesh elements, specifying at least some other mesh elements as nearby mesh elements or far-away mesh elements, whereby corresponding pairs of mesh elements are specified as nearby mesh-element pairs or far-away mesh-element pairs for corresponding calculations of nearby components and far-way components of voltage values.

According to another aspect, the method may further include: specifying a grid for modeling the integrated circuit, the grid including a plurality of grid points for defining values on the grid, wherein approximating the far-away components of the first-layout voltage values includes calculating a spatial-frequency expansion for modeling an electromagnetic field across the integrated circuit by a first summation of spatial-frequency functions that are defined across the grid, and approximating the far-away components of the second-layout voltage values includes calculating a spatial-frequency expansion for modeling an electromagnetic field across the integrated circuit by a second summation of the spatial-frequency functions that are defined across the grid.

In another embodiment of the present invention, a method for modeling an integrated circuit (IC) includes: specifying a first layout for the integrated circuit, wherein the first layout includes a plurality of devices and a specification of parameters, placement and routing for the devices; specifying a mesh for modeling the integrated circuit, wherein the mesh includes a plurality of mesh elements for defining values on the mesh; specifying a grid for modeling the integrated circuit, wherein the grid includes a plurality of grid points for defining values on the grid; for at least some mesh elements, specifying at least some other mesh elements as nearby mesh elements or far-away mesh elements, whereby corresponding pairs of mesh elements are specified as nearby mesh-element pairs or far-away mesh-element pairs; determining direct values for modeling impedances at nearby mesh-element pairs of the first layout; determining pre-correction values for modeling impedances at nearby mesh-element pairs of the first layout; and determining indirect values for modeling impedances at far-away mesh-element pairs of the first layout.

The method further includes: specifying first-layout current values at the mesh elements for modeling current flow in the first layout; determining first-layout voltage values at the mesh elements, wherein determining the first-layout voltage values includes: determining a nearby component for the first-layout voltage values from the first-layout current values, the direct values, and the pre-correction values, and determining a far-away component for the first-layout voltage values from the first-layout current values and the indirect values.

The method further includes: specifying a second layout for the integrated circuit by changing placement of at least one device in the specification of the first layout; specifying second-layout current values at the mesh elements for modeling current flow in the second layout; determining second-layout voltage values at the mesh elements, wherein determining the second-layout voltage values includes: determining a nearby component for the second-layout voltage values from the second-layout current values, the direct values, and the pre-correction values; and determining a far-away component for the second-layout voltage values from the second-layout current values and the indirect values; and saving at least some values for the integrated circuit (e.g., in an computer-readable medium).

According to one aspect of this embodiment, the mesh may define a basis-function expansion for modeling an electromagnetic field across the integrated circuit by a summation of basis functions that are defined across mesh elements by polynomial interpolations of corresponding mesh-element values.

According to another aspect, the grid may define a spatial-frequency expansion for modeling an electromagnetic field across the integrated circuit by a summation of spatial-frequency functions that are defined across the grid.

According to another aspect, specifying pairs of mesh elements as nearby mesh-element pairs or far-away mesh-element pairs may include calculating a distance between mesh-element pairs and comparing the distance between mesh-element pairs to a threshold distance.

According to another aspect, determining the direct values may include calculating potential values for an expansion of an electromagnetic field defined by values at the mesh elements.

According to another aspect, determining the pre-correction values may include calculating a spatial-frequency approximation for electromagnetic interactions between nearby mesh-element pairs.

According to another aspect, determining the indirect values may include calculating a spatial-frequency approximation for electromagnetic interactions between far-away mesh-element pairs.

According to another aspect, the method may further include: specifying a first-layout voltage input, wherein the specified first-layout current values provide an approximation for current values corresponding to the first-layout voltage input; and specifying a second-layout voltage input that is equivalent to the first-layout voltage input, wherein the specified second-layout current values provide an approximation for current values corresponding to the second-layout voltage input.

According to another aspect, the method may further include: determining projection values for projecting values from the mesh to the grid; and determining interpolation values for interpolating values from the grid to the mesh, wherein: determining the nearby component for the first-layout voltage values includes calculating a matrix combination of the first-layout current values with the direct values and the pre-correction values, and determining the nearby component for the second-layout voltage values includes calculating a matrix combination of the second-layout current values with the direct values and the pre-correction values.

According to another aspect, the method may further include: determining projection values for projecting values from the mesh to the grid; and determining interpolation values for interpolating values from the grid to the mesh, wherein: determining the far-away component for the first-layout voltage values includes operations for projecting values from the mesh to the grid, convolving values on the grid, and interpolating values from the mesh to the grid, and determining the far-away component for the second-layout voltage values includes operations for shifting and projecting values from the mesh to the grid, convolving values on the grid, and shifting and interpolating values from the grid to the mesh, wherein the operations for shifting values on the mesh and on the grid correspond to differences between the first layout and the second layout.

According to another aspect, the method may further include: determining the mesh based on a first error criterion for simulating the integrated circuit; and determining the grid based on a second error criterion for modeling electromagnetic interactions between far-away mesh-element pairs.

According to another aspect, the method may further include: determining a plurality of first-layout current values and first-layout voltage values for calculating first-layout operating-point current values that correspond to first-layout operating-point voltage values, wherein the first-layout operating-point current values and the first-layout operating-point voltage values characterize an operating point of the first layout; and determining a plurality of second-layout current values and second-layout voltage values for calculating second-layout operating-point current values that correspond to second-layout operating-point voltage values, wherein the second-layout operating-point current values and the second-layout operating-point voltage values characterize an operating point of the second layout that corresponds to the operating point of the first layout.

In another embodiment of the present invention, a method for modeling an integrated circuit (IC) includes: specifying a layout for the integrated circuit, the layout including a plurality of devices and a specification of parameters, placement and routing for the devices; and building a model for the layout from at least some device models in a device-modeling library; and saving at least some values for the model (e.g., in a computer-readable medium), wherein the device-modeling library includes at least one family of device models for modeling devices, each device model including a plurality of mesh elements for modeling devices and a plurality of direct values for modeling impedances for at least some pairs of mesh elements, and the model includes: a mesh that includes a plurality of mesh elements for defining values on the mesh, wherein at least some pairs of mesh elements are specified as nearby mesh-element pairs or far-away mesh-element pairs for modeling impedances, a grid that includes a plurality of grid points for defining values on the grid, direct values for modeling impedances at nearby mesh-element pairs of the layout, pre-correction values for modeling impedances at nearby mesh-element pairs of the layout, indirect values for modeling impedances at far-away mesh-element pairs of the layout, projection values for projecting values from the mesh to the grid, and interpolation values for interpolating values from the grid to the mesh.

According to one aspect of this embodiment, the method may further include: operating the model on layout current values at the mesh elements to determine layout voltage values at the mesh elements, wherein operating the model includes: determining a nearby component for the layout voltage values from the layout current values, the direct values, and the pre-correction values; and determining a far-away component for the layout voltage values from the layout current values and the indirect values.

Additionally, with respect to this aspect, determining the nearby component for the layout voltage values may include calculating a matrix combination of the first-layout current values with the direct values and the pre-correction values.

According to another aspect, determining the far-away component for the layout voltage values may include projecting values from the mesh to the grid, convolving values on the grid, and interpolating values from the mesh to the grid.

According to another aspect, the method may further include: approximating an operating point for the layout by determining operating-point current values that correspond to given operating-point voltage values, wherein approximating the operating point includes determining a plurality of layout current values and layout voltage values for calculating the operating-point current values that correspond to the operating-point voltage values.

Additional embodiments relate to an apparatus for carrying out any one of the above-described methods, where the apparatus may include a computer for executing instructions related to the method. For example, the computer may include a processor with memory for executing at least some of the instructions. Additionally or alternatively the computer may include specialized circuitry or other hardware for executing at least some of the instructions. Additional embodiments also relate to a computer-readable medium that stores (e.g., tangibly embodies) a computer program for carrying out any one of the above-described methods with a computer.

In these ways the present invention enables IC modeling tools for determining accurate solutions that can be flexibly used when designs are incrementally adapted from other designs or design elements.

BRIEF DESCRIPTION OF THE DRAWINGS

FIGS. 7A, 7B and 7C show details for an incremental solution related to the embodiment shown in FIG. 5.

FIG. 8 shows a flow diagram of a library-based solver for an embodiment of the present invention.

DETAILED DESCRIPTION OF EXEMPLARY EMBODIMENTS

Figure 1:
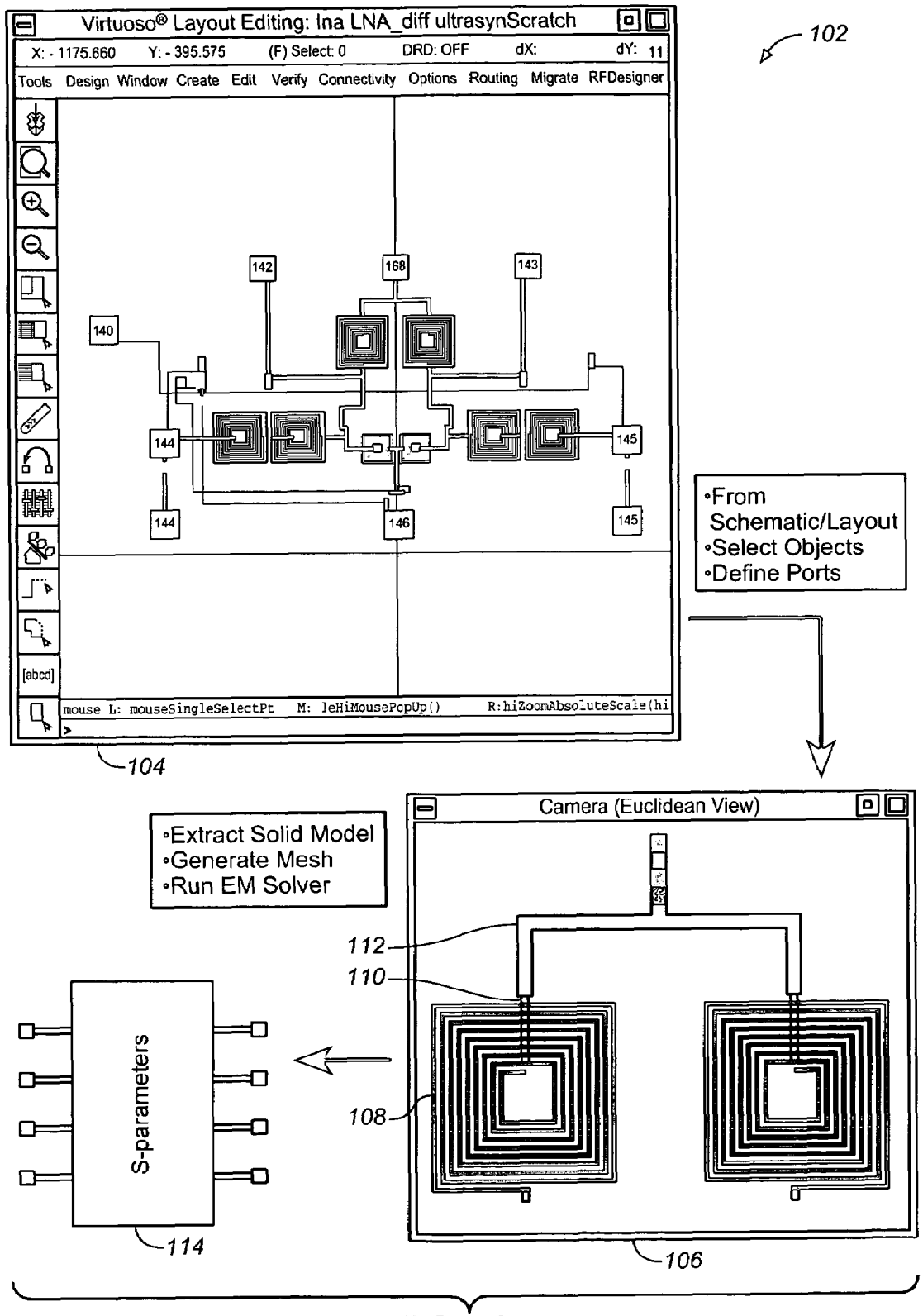
FIG. 1 shows an operational overview for an embodiment of the present invention.

FIG. 1 shows an operational overview 102 for an embodiment of the present invention. From an IC (integrated circuit) schematic or layout 104, an extraction 106 is selected for modeling. Typically this extraction, which may also be considered as a layout, includes a number of objects 108 (e.g., inductors as shown) with associated ports 110 and interconnect 112. As discussed below in further detail, the modeling process for the extraction 106 includes determining a solid model, generating a corresponding mesh (e.g., a discretization) and running an EM (electromagnetic) solver to estimate parasitic effects by determining corresponding S-parameters 114 (or some alternative characterization).

Figure 2:
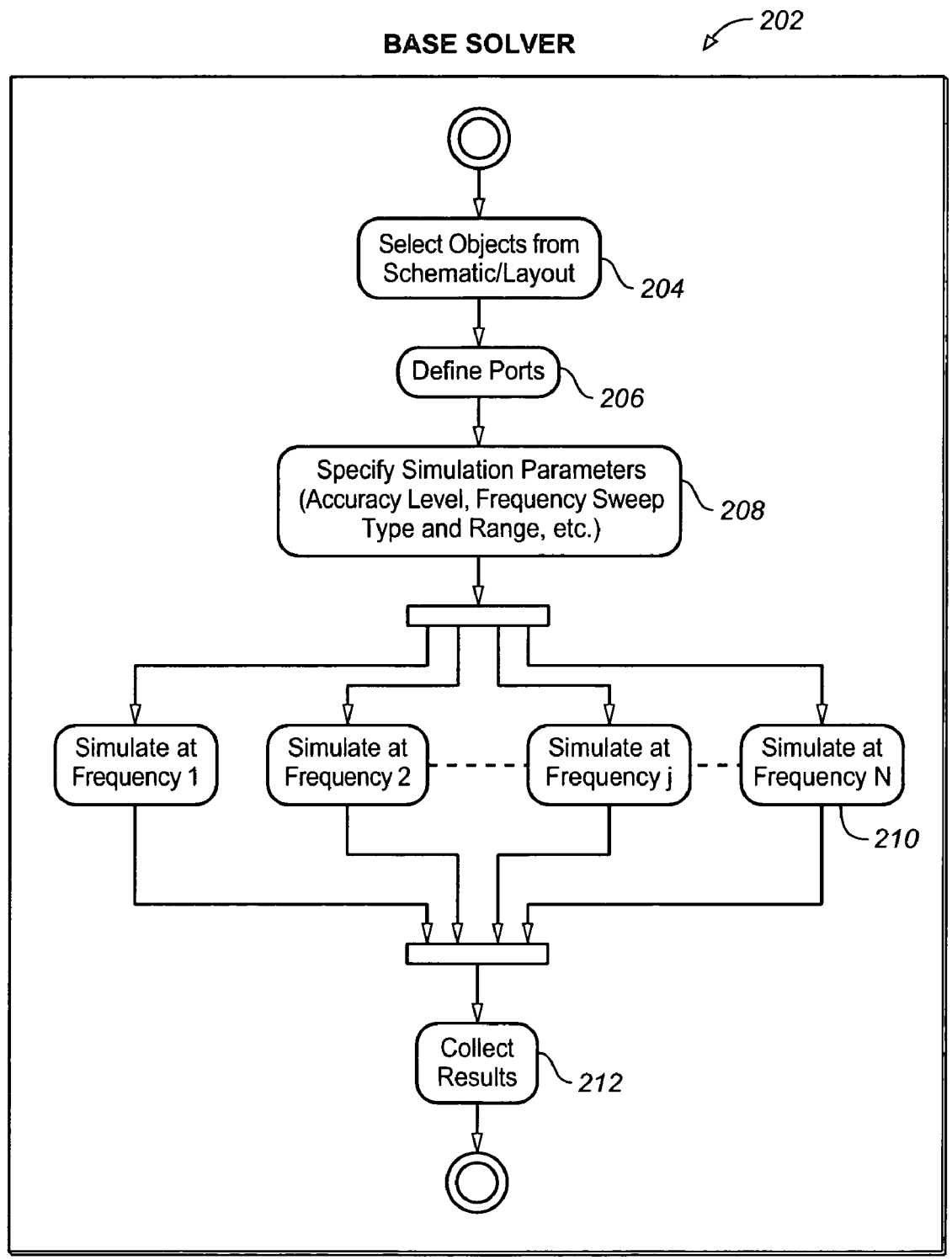
FIG. 2 shows an exemplary flow diagram for a base solver.

FIG. 2 shows an exemplary flow diagram 202 for a base solver (e.g., a basic IC modeler for relating voltages and currents). First objects are selected 204 from a schematic or layout. Next ports are defined 206. Next simulation parameters are specified 208 (e.g., accuracy level, frequency sweep type and range, etc.). Then the model is simulated 210 at a number of frequencies (e.g., N frequencies as shown). Finally the results are collected 212.

Figure 3:
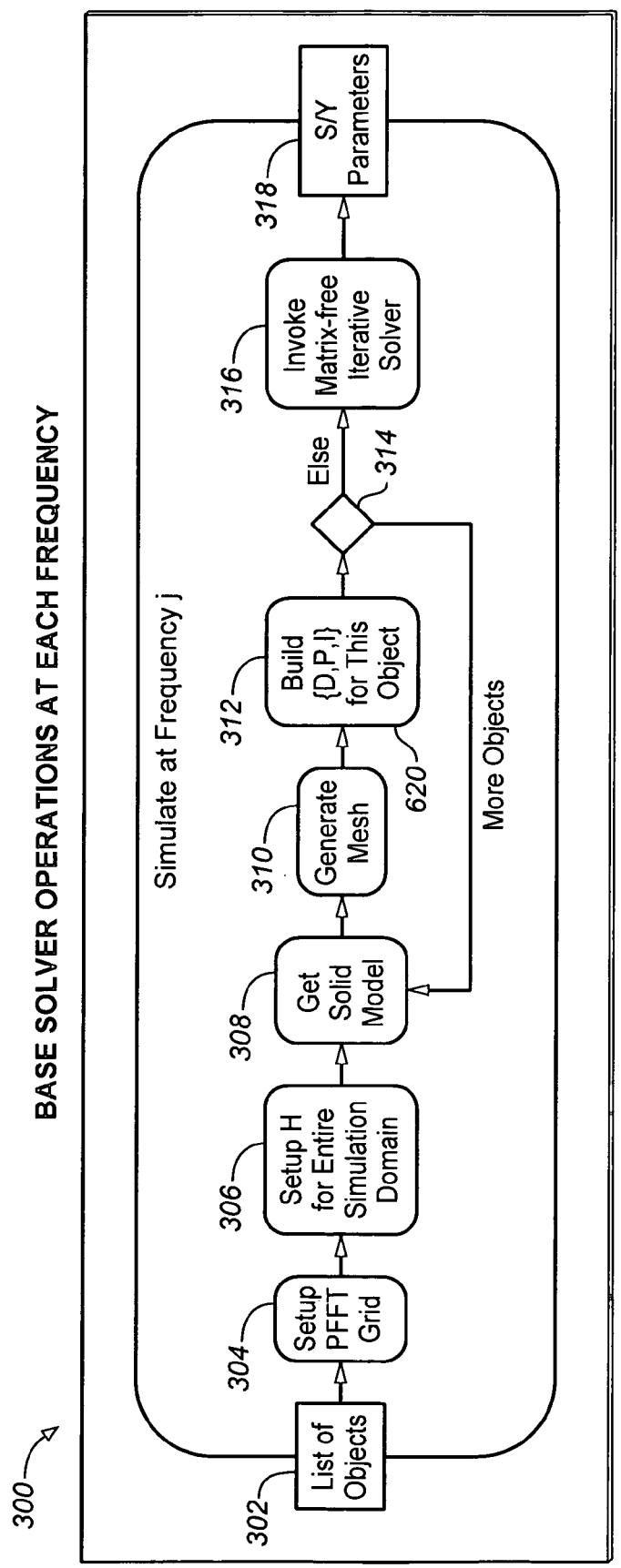
FIG. 3 shows an exemplary flow diagram for operations at each frequency in the base solver of FIG. 2.

FIG. 3 shows an exemplary flow diagram 300 for simulations 210 at each frequency in the base solver 202 of FIG. 2. First a list of objects is selected 302 for simulation. Next a PFFT (Pre-corrected Fast Fourier Transform) grid is set up 304. Next indirect values (e.g., matrix H as show) are determined 306 for the simulation. Next, a solid model is specified 308 for the simulation, a mesh is generated 310, and direct values, projection values, and interpolation values are determined 312 (e.g, matrices D, P, and I as shown). Notably, a decision can be made 314 for adding additional objects in this process (e.g., from the list of objects 302). Then the resulting system is solved 316 for relating voltages and currents, preferably by a matrix-free iterative solver. Finally S-parameters (or alternatively Y-parameters as shown) are extracted for modeling parasitic effects. (See, for example, "On deembedding of port discontinuities in full-wave CAD models of multiport circuits," V. I. Okhmatovski et al., *IEEE Trans. Microw. Theory Tech.*, vol. 51, no. 12, pp. 2355-2365, December 2003.)

Figure 4:
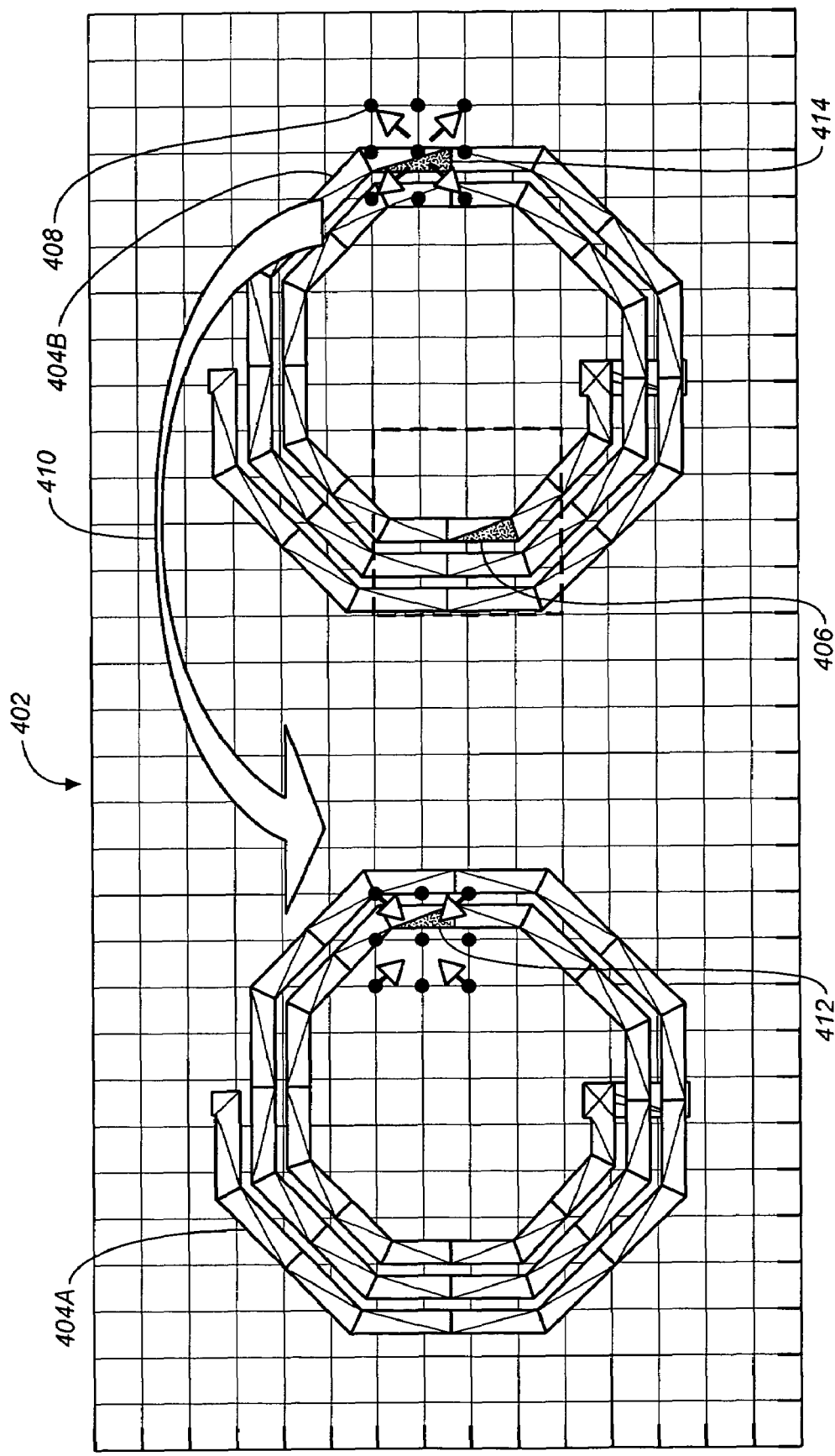
FIG. 4 shows a detail for a circuit layout related to the base solver shown in FIG. 2.

In general, a circuit layout is defined by specifying parameters, placement and routing for a number of devices. FIG. 4 shows a detail for a circuit layout 402 related to the base solver shown in FIG. 2. Two inductors 404A, 404B have been selected for the simulation and are represented in FIG. 2 as solid models with physical dimensions.

The solid models 404A, 404B are discretized by triangular mesh elements 406. In general, the mesh defines a basis-function expansion for modeling an electromagnetic field across the integrated circuit by a summation of basis functions that are defined across mesh elements by polynomial interpolations of corresponding mesh-element values (e.g., linear interpolation from values at the edges).

In addition to the mesh elements 406, an overlapping discrete model is provided by grid points 408 for a PFFT (Pre-corrected Fast Fourier Transform) grid with arrows indicating interaction directionality between grid points 408. In general, the grid defines a spatial-frequency expansion for modeling an electromagnetic field across the integrated circuit by a summation of spatial-frequency functions that are defined across the grid.

In the following analysis, interactions between nearby mesh elements 406 are modeled by the direct values, and interactions 410 between far-away mesh elements 412, 414 are modeled by indirect values. That is, pairs of mesh elements are designated as nearby or far-away (e.g, based on some threshold distance value) so that there interactions (e.g., impedance relationships) can be modeled accordingly. For example, in many operational settings it is preferable to use a simple "nearest neighbors" rule where directly neighboring mesh-element pairs (e.g, sharing at least a point or an edge) are designated as nearby while other pairs are designated as far-away pairs. One advantage of this approach is that designations of nearby or far-away for pairs of mesh elements are unlikely to change as the layout is incrementally changed. As discussed below, this allows greater re-use of the calculated values as the layout is changed incrementally.

In this context, we assume that the mesh dimension is n and the grid dimension is m, so that interactions between pairs of mesh elements are modeled with vectors of different sizes depending on the designated proximity of the mesh element pairs. Collectively, these interactions can be modeled by the equation:

$$Ax=(D-\hat{D})x+IHPx. \quad (1)$$

Typically the n-dimensional vector x includes coefficients for the basis function expansion of the mesh elements and represents current in the layout. The n-x-n matrix A models impedance values so that Ax represents voltage in the layout. The representation on the right-hand-side of eq. 1 represents different modeling for pairs of nearby and far-away elements.

The matrix D represents direct values for modeling impedances of nearby pairs of mesh elements. Typically, the direct values are determined by calculating potential values for an expansion of an electromagnetic field defined by values at the mesh elements. Conceptually, D is an n-x-n sparse matrix with non-zero values close to the diagonal for modeling interactions between basis functions for nearby mesh elements.

The matrix $\hat{D}$ represents pre-correction values for modeling impedances at nearby pairs of mesh elements to correct for PFFT grid calculations for these interactions. Typically these pre-correction values are determined by calculating a spatial-frequency approximation on the PFFT grid for electromagnetic interactions between nearby mesh-element pairs (e.g., through a convolution across the spatial frequencies defined by the PFFT grid) and then projecting back to the mesh-elements. Conceptually, $\hat{D}$ is an n-x-n sparse matrix with non-zero values close to the diagonal for modeling interactions between basis functions for nearby mesh elements.

The matrix H represents indirect values for modeling impedances at far-away pairs of mesh elements. Typically these indirect values are determined by calculating a spatial-frequency approximation on the PFFT grid for electromagnetic interactions between far-away mesh-element pairs (e.g., through a convolution across the spatial frequencies defined by the PFFT grid). Conceptually H is an m-x-m matrix that is typically implemented by means of an FFT (Fast Fourier Transform).

The matrix P represents projection values for projecting from the mesh coordinates (n-dimensional) to the grid coordinates (m-dimensional) where far-away interactions are modeled. Conceptually, P is an m-x-n matrix. The matrix I represents interpolating values for projecting from the grid coordinates (m-dimensional) to the mesh coordinates (n-dimensional). Conceptually, I is an n-x-m matrix.

In general, these matrices need not be formed explicitly. Typically a modeling goal relates to determining the currents that correspond to a nominal voltage input; That is one wishes to solve the equation Ax=b for given b, which represents a voltage input (e.g., a unit input at the location of a single port). However, because of the size of the matrices, this problem is typically solved iteratively (e.g., by a generalized minimal residual method or a conjugate gradient method), and so the model represented by eq. 1 is implemented by forming matrix-vector products (Ax). Therefore, the focus of much of the following discussion relates to forming these matrix-vector products rather than actually solving the matrix equation Ax=b. In this context, a good initial approximation for x (e.g, current values) that corresponds to a given b (e.g., voltage values) reduces the number of iterations required to solve the matrix equation Ax=b.

As will be discussed in greater detail below, the present invention enables re-use of the calculated values for these matrices in cases where incremental changes are made in the layout. In many operational settings (e.g., where a "small" change has been made in the layout), the matrices D, $\hat{D}$, and H are unchanged from one layout to the next (because the designations for nearby and far-away pairs do not change for "small" changes in the layout), while P and I maintain the same coefficients but have shifted grid indices (to reflect "small" changes in the layout).

The improved efficiency by reusing these calculated values can be substantial because of the typical dimensions involved in these matrix equations (e.g., n >1,000, m>1,000). In general, the size of n, the size of the mesh discretization, is driven by overall accuracy requirements for simulating the integrated circuit. Then, for a given separation of mesh-element pairs into nearby and far-away pairs, the size of m, the PFFT (or spatial frequency) discretization is driven by the accuracy requirements for the far-away pairs. Note that when only directly neighboring mesh-element pairs (e.g, according to some threshold distance) are designated as nearby while other pairs are designated as far-away pairs, the size of the PFFT grid may be relatively large since the PFFT grid must resolve interactions between mesh element pairs that are physically closer together and therefore require more spatial frequencies for accurate resolution. In general, there is a trade-off between the advantages of a severe definition (e.g., a "nearest neighbors" rule) for designating pairs of mesh elements as nearby or far-away and the corresponding size of the PFFT grid needed for adequately resolving interactions between far-away mesh element pairs. In some operational settings it is desirable to define the PFFT grid so that its size is comparable to that of the mesh elements, thereby making it easier to calculate projections and interpolations between the PFFT grid and the mesh elements.

Additional details related to the decomposition given by eq. 1 can be found in U.S. Patent Application Publication No. 2005/0076317 A1, "Method and apparatus for determining interactive electromagnetic effects among conductors of a multi-layer circuit" (Apr. 7, 2005), which is incorporated herein by reference in its entirety, and also in "Large-scale Broad-band Parasitic Extraction for Fast Layout Verification of 3-D RF and Mixed-Signals On-chip Structures", F. Ling et al., IEEE Transactions on Microwave Theory and Techniques, Vol. 53, No. 1, January 2005.

For example, in U.S. Patent Application 2005-0076317, calculations involving "basis functions on triangles" and the "FFT grid" are summarized in FIG. 10 with reference to equations 11, 16, and 17 and with additional details provided in related portions of the specification. In the above-cited IEEE reference, the relevant matrix equation (Ax=b in the present specification) is given by equation (13) and the separation into "near and far interactions" is characterized by equations (15), (16), (22), (23) and related portions of the text.

Figure 5:
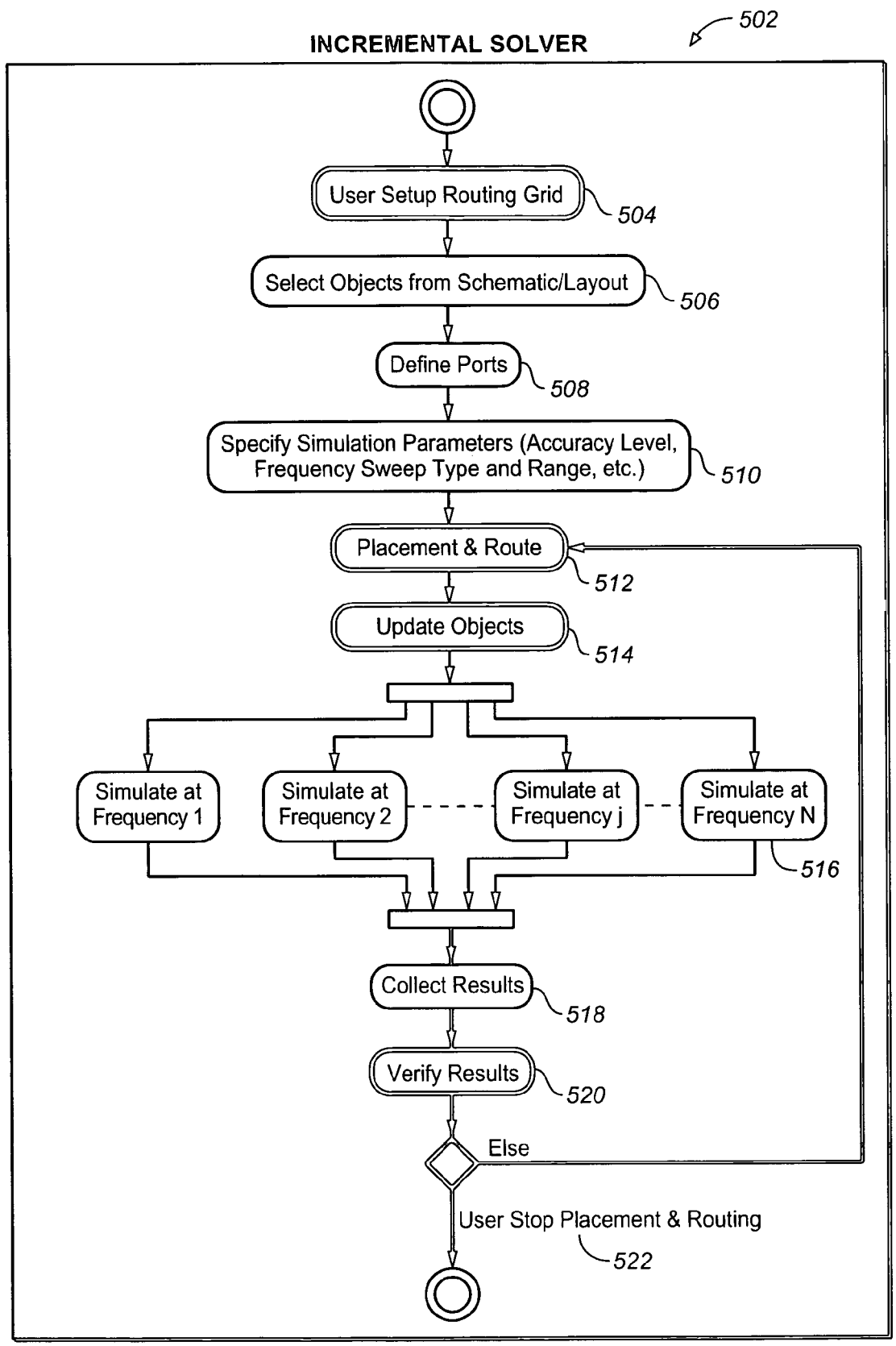
FIG. 5 shows a flow diagram of an incremental solver for an embodiment of the present invention.

FIG. 5 shows a flow diagram 502 of an incremental solver for an embodiment of the present invention. First a user sets up 504 a routing grid. Next objects are selected 506 from a schematic or layout. Next ports are defined 508. Next simulation parameters are specified 510 (e.g., accuracy level, frequency sweep type and range, etc.). Placement and routing are adjusted 512 and objects are updated 514 as desired by the user (e.g., to examine the effect of adjusting placement and routing on the design). Next the model is simulated 516 at a number of frequencies (e.g., N frequencies as shown). The results are collected 518 and then verified 520 as required (e.g., by additional simulations using the extracted S-parameters). The process can be continued by further adjusting placement and routing 512 or updating objects 514, etc., until the process is terminated 522 by the user. The shading for setting up 504 a routing grid, adjusting 512 placement and routing, updating 514 the objects, and verifying results 520 indicate differences as compared with the flow diagram 202 for the base solver in FIG. 2.

Figure 6:
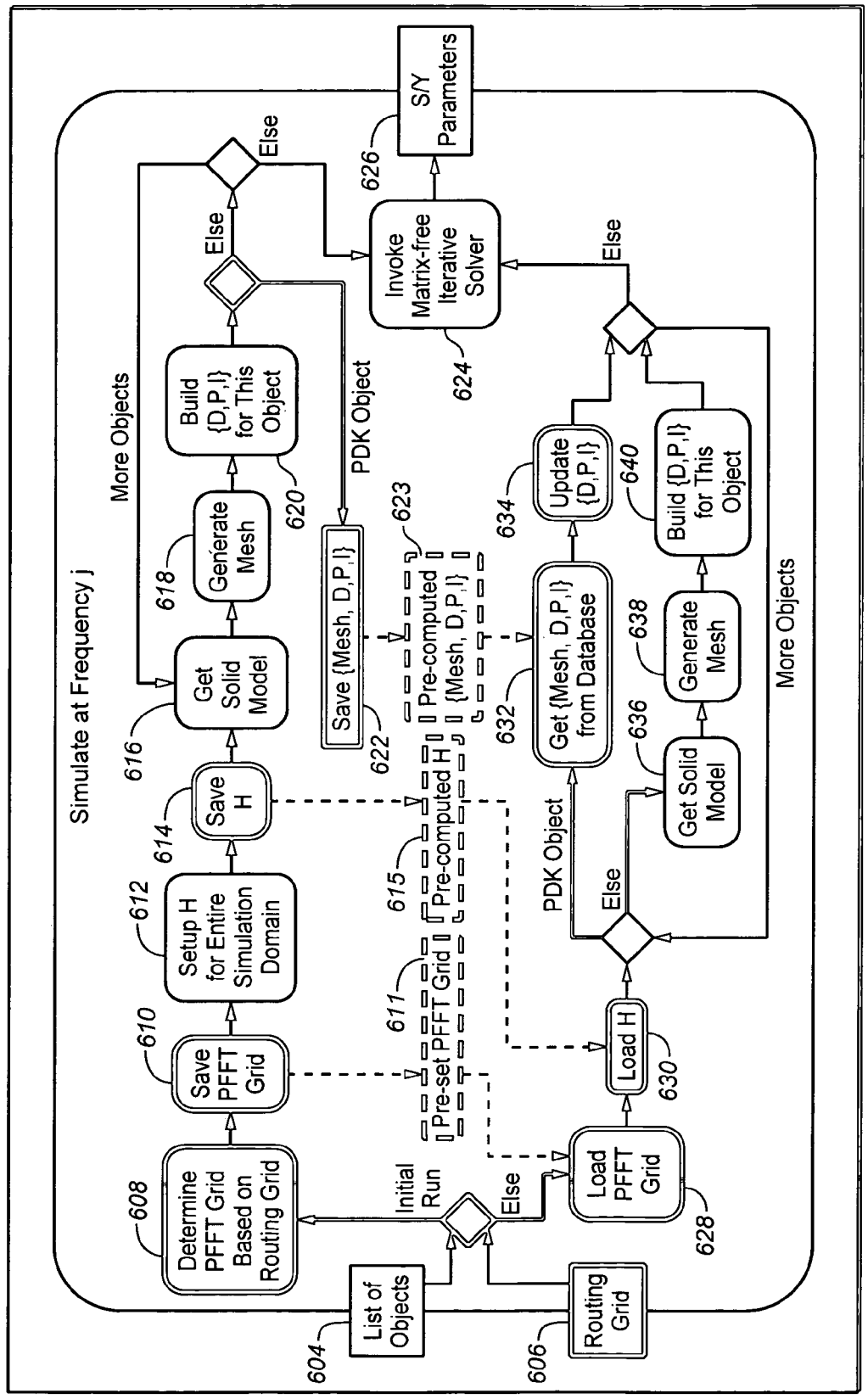
FIG. 6 shows a flow diagram for operations at each frequency in the embodiment of FIG. 5.

FIG. 6 shows a flow diagram 602 for simulations 516 at each frequency in the embodiment of FIG. 5. From the list of objects 604 and the routing grid 606 an initial run begins with determining 608 the PFFT grid based on the routing grid 606. The PFFT grid is saved 610 so that a pre-set PFFT grid 611 is available for future operations. Next indirect values (e.g., matrix H as show) are determined 612 and saved 614 so that pre-computed indirect values 615 are available for future operations. Next, a solid model is specified 616 for the simulation, a mesh is generated 618, and direct values, projection values, and interpolation values are determined 620 (e.g, matrices D, P, and I as shown). These mesh values, direct values, projection values, and interpolation values are then saved (e.g, as a PDK (Process Design Kit) object as shown) so that pre-computed values 623 are available for future operations. At this point more objects can be added to the model (e.g, at the steps for getting the solid model 616, generating mesh 618 and building direct values, projection values, and interpolation values 620). Then, when the model is complete, the model can be used to determine voltage-current relationships, preferably by invoking a matrix-free iterative solver 624. Finally the S-parameters or Y-parameters can be obtained 626.

After the initial run, pre-set values 611, 615, 623 for the simulation. That is, the PFFT grid can be loaded 628 from pre-set values 611. Then the indirect values (e.g., matrix H as show) can be loaded 630 from the pre-computed values 615. For building objects into the model, the process can proceed based on whether a corresponding PDK object has been stored. That is, if a PDK object is available from storage, then mesh values, direct values, projection values, and interpolation values are determined 312 (e.g, mesh representations, and matrices D, P, and I as shown) can be obtained from pre-computed values 623 and updated 634 as needed. Alternatively, a solid model can be specified 636, a mesh generated 638, and direct values, projection values, and interpolation values determined 640 (e.g, matrices D, P, and I as shown). Then, similarly as in the initial run, Then, when the model is complete, the model can be used to determine voltage-current relationships, preferably by invoking a matrix-free iterative solver 624. Finally the S-parameters or Y-parameters can be obtained 626.

Figure 7A:
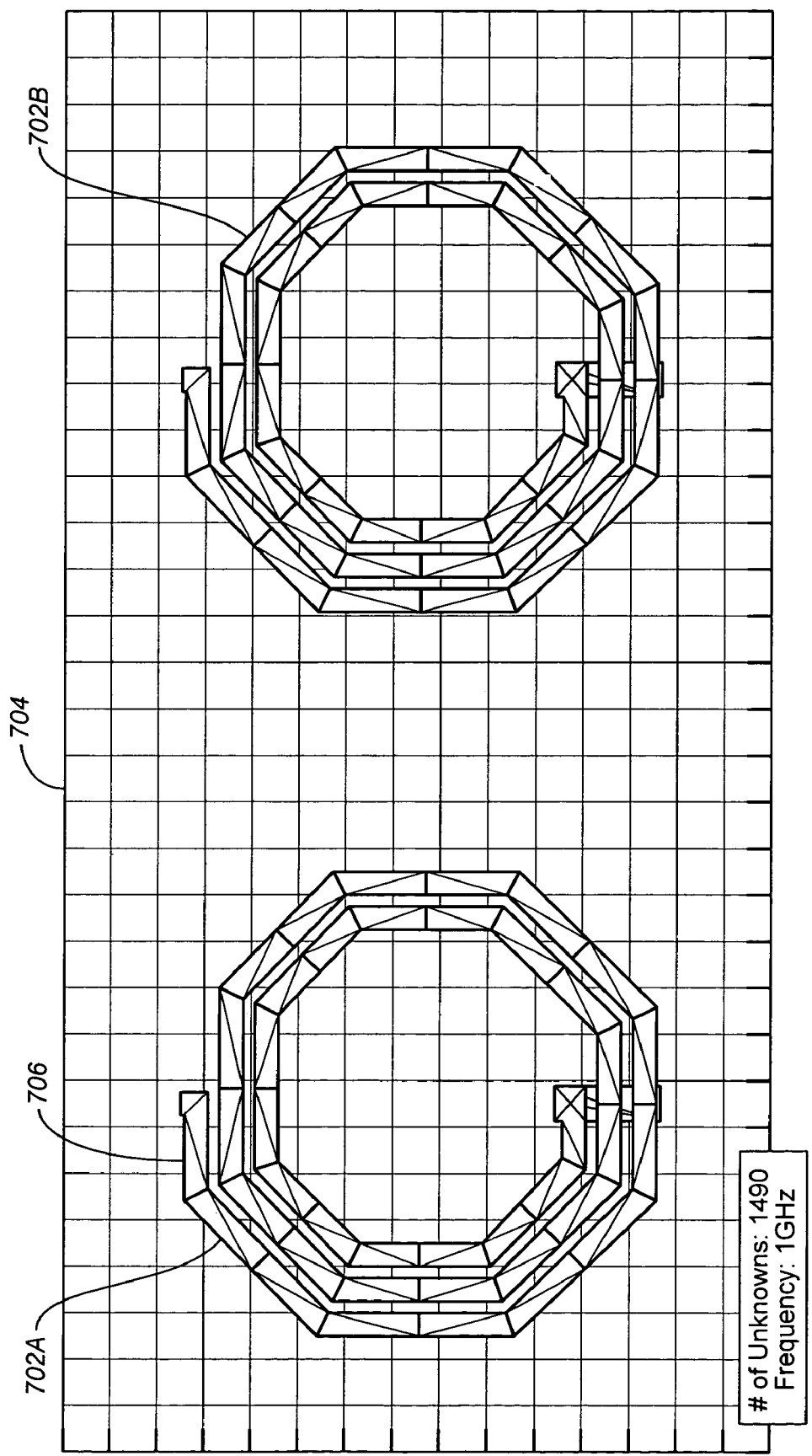
Figure 7B:
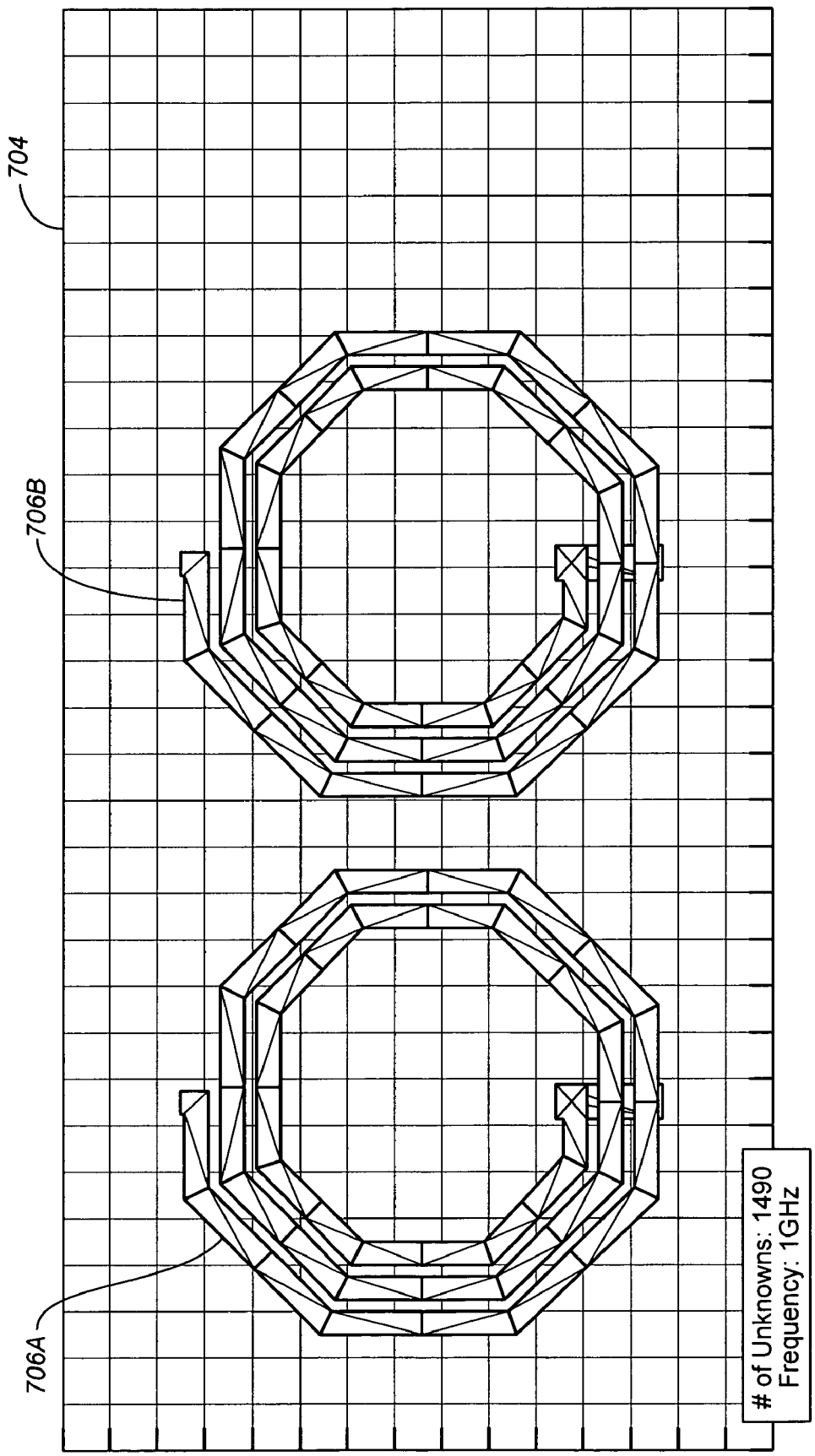

FIGS. 7A, 7B and 7C show details for an incremental solution related to the embodiment shown in FIG. 5. In FIG. 7A two inductors 702A, 702B are shown overlaid on the PFFT grid 704, with triangular mesh elements 706 indicated on the inductors 702A, 702B. (The distance between grid points 704 is approximately 10 microns for this example.) FIG. 7B shows an incremental change in the layout where the first inductor 706A has remained fixed and the second inductor 706B has been moved closer. In this case directly neighboring mesh-element pairs (e.g, sharing at least a point or an edge) are designated as nearby while other pairs are designated as far-away pairs. Therefore, the incremental change in the layout does not change the designations for nearby and far-away pairs and the calculations related to the decomposition given by eq. 1 can be substantially reused. That is, the matrices D, $\hat{D}$, and H are unchanged from one layout to the next, while P and I maintain the same coefficients but have shifted grid indices to reflect the changes in the layout.

In this example, the number of unknowns (in the mesh model) is 1490, and the simulation frequency is 1 GHz. FIG. 7C shows the improvement in computational speed that results from the incremental solver. For the initial run for modeling the layout in FIG. 7A, the setup time (e.g., for building the model 608, 612, 616, 618, 620) was 40 seconds and iterative solution time 624 was 3.7 seconds, which included 16 iterations of a conventional Generalized Minimal Residual (GMRES) method (e.g., starting from a zero-valued initial guess). For the incremental run for modeling the layout in FIG. 7B, the setup time was zero seconds (i.e, the previously calculated values were reused 611, 615, 623 with re-indexing of the grid points in the PFFT grid to account for moving the second inductor 706B). The iterative solution time 623 was 1.8 seconds for 7 iterations of the GMRES method, where fewer iterations were required because the solution from the initial run was used to initialize the GMRES method in the incremental run. (In general, the solution from initial run provides the best available initial guess for the iterative solver 624.)

FIG. 8 shows a flow diagram 802 of a library-based solver for an embodiment of the present invention, where this library-based solver can be used for simulations 516 at each frequency in the embodiment of FIG. 5. This flow diagram 802 is similar to the lower half of the flow diagram 602 in FIG. 6 where modeling values (e.g, for matrices D, P, H, I) were computed in the initial run and then reused 611, 615, 623.

From the list of objects 804 and the routing grid 806 an PFFT grid is determined 808 based on the routing grid 806. Next indirect values (e.g., matrix H) are determined 810. Next the model is assembled by adding modeling values for each object in the list of objects 804. In the case where a PDK object is available from a pre-characterized database 812, mesh values and the direct values (e.g, matrix D) are obtained 814 from the database 812, which is analogous to the pre-computed values 623 in FIG. 6. Then the direct values (e.g, matrix D) are updated 816 if necessary for the object, and the related projecting and interpolating values (e.g, matrices P, I) are calculated. In the case where a PDK object is not available from the pre-characterized database 812, a solid model can be specified 820, a mesh generated 822, and direct values, projection values, and interpolation values determined 824 (e.g, matrices D, P, and I), which is analogous to equivalent operations 636, 638, 640 in FIG. 6.

Then, when the model is complete, the model can be used to determine voltage-current relationships, preferably by invoking a matrix-free iterative solver 826. Finally the S-parameters or Y-parameters can be obtained 828.

Figure 9:
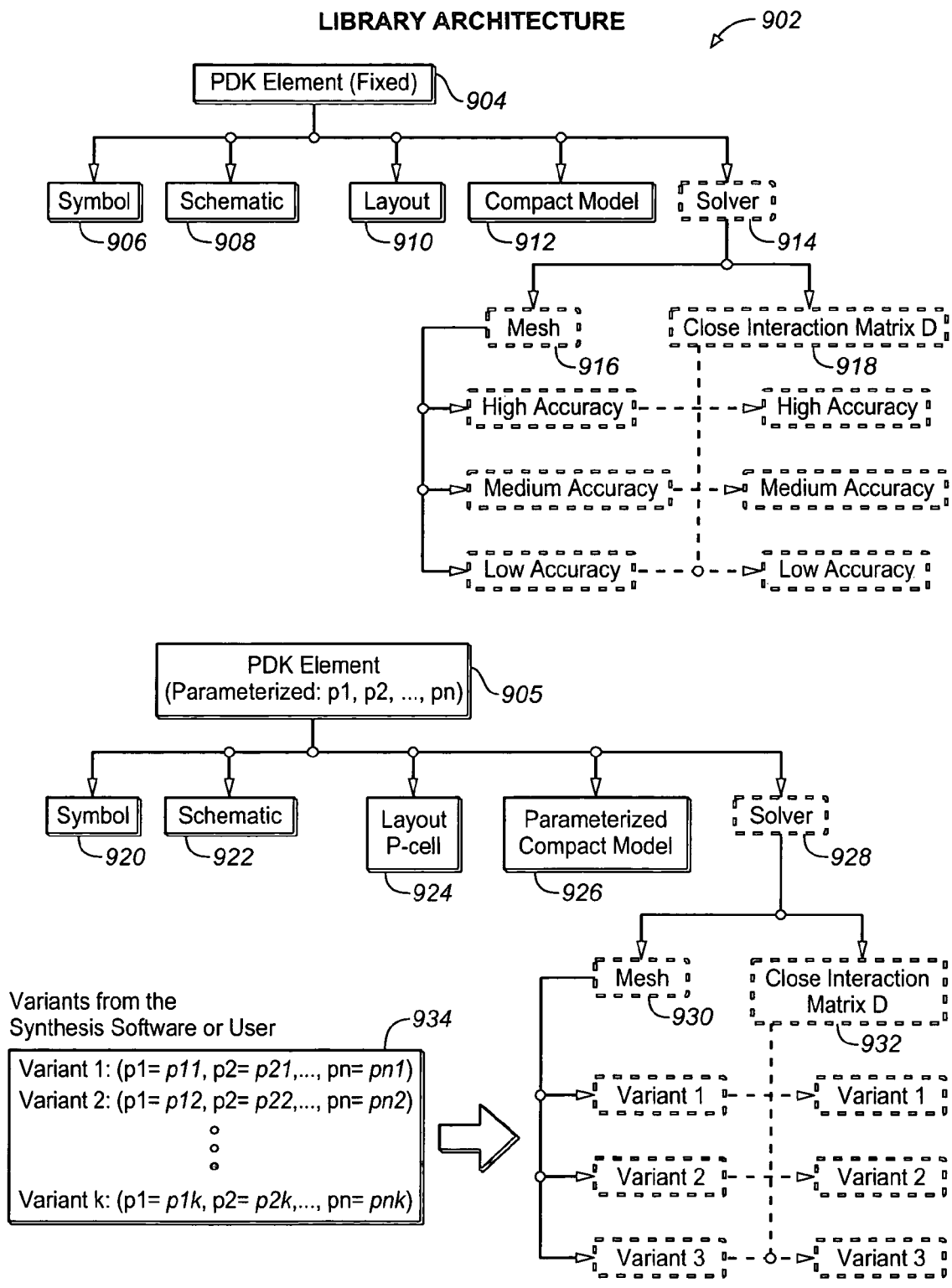
FIG. 9 shows a library architecture related to the embodiment of FIG. 8.

FIG. 9 shows a library architecture related to the embodiment of FIG. 8 (e.g., for specifying elements of the pre-characterized database 812). Two library elements are shown: a fixed (e.g., nonparametric) PDK element 904 and a parameterized PDK element 905. The fixed PDK element 904 includes data fields for symbol 906, schematic 908, layout 910 and compact model 912, all of which represent conventional PDK characteristics. Additionally the element 904 contains data fields labeled solver 914 with entries for mesh-values 916 and direct values (e.g., matrix D) 916, where these entries are indexed by their accuracy (e.g., high 920, medium 922 and low 924) so that, for a given accuracy, corresponding values for mesh 916 and direct values 918 can be can be extracted for the IC model.

Similarly the parameterized PDK element 905 (parameterized here by $p_1, \ldots p_n$) includes data fields for conventional features including symbol 920, schematic 922, layout 924 and compact model 926. Additionally the element 905 contains data fields labeled solver 928 with entries for mesh-values 930 and direct values (e.g., matrix D) 932, where these entries are indexed as different variants 934 (e.g, variant 1, variant 2, etc.) of the parametric values, where these variants may relate to accuracy (as in the solver fields 914 for the fixed element 904) as well as other IC design characteristics (e.g., geometrical scale factors, frequency dependencies, etc.).

Additional embodiments relate to an apparatus for carrying out any one of the above-described methods, where the apparatus may include a computer for executing instructions related to the method. In this context the computer may be a general-purpose computer including, for example, a processor, memory, storage, and input/output devices (e.g., monitor, keyboard, disk drive, Internet connection, etc.). However, the computer may include specialized circuitry or other hardware for carrying out some or all aspects of the method. In some operational settings, the apparatus may be configured as a system that includes one or more units, each of which is configured to carry out some aspects of the method either in software, in hardware or in some combination thereof.

Additional embodiments also relate to a computer-readable medium that stores (e.g., tangibly embodies) a computer program for carrying out any one of the above-described methods by means of a computer. The computer program may be written, for example, in a general-purpose programming language (e.g., C, C++) or some specialized application-specific language. The computer program may be stored as an encoded file in some useful format (e.g., binary, ASCII).

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

What is claimed is:

1. A system for modeling an integrated circuit (IC), comprising:
    a device-modeling library that includes at least one family of device models for modeling devices, each device model including a plurality of mesh elements for modeling devices and a plurality of direct values for modeling impedances for at least some pairs of mesh elements;
    a layout specifier that is configured for specifying a layout for the integrated circuit, the layout including a plurality of devices and a specification of parameters, placement and routing for the devices; and
    a model builder that is configured for building a model for the layout from at least some device models in the device-modeling library and saving at least some values for the model, wherein
    the model includes: a mesh that includes a plurality of mesh elements for defining values on the mesh, wherein at least some pairs of mesh elements are specified as nearby mesh-element pairs or far-away mesh-element pairs for modeling impedances, a grid that includes a plurality of grid points for defining values on the grid, direct values for modeling impedances at nearby mesh-element pairs of the layout, pre-correction values for modeling impedances at nearby mesh-element pairs of the layout, indirect values for modeling impedances at far-away mesh-element pairs of the layout, projection values for projecting values from the mesh to the grid, and interpolation values for interpolating values from the grid to the mesh.

2. A system according to claim 1, wherein:
    the mesh defines a basis-function expansion for modeling an electromagnetic field across the integrated circuit by a summation of basis functions that are defined across mesh elements by polynomial interpolations of corresponding mesh-element values.

3. A system according to claim 1, wherein:
    the grid defines a spatial-frequency expansion for modeling an electromagnetic field across the integrated circuit by a summation of spatial-frequency functions that are defined across the grid.

4. A system according to claim 1, wherein: the model builder specifies pairs of mesh elements as nearby mesh-element pairs or far-away mesh-element pairs by calculating a distance between mesh-element pairs and comparing the distance between mesh-element pairs to a threshold distance.

5. A system according to claim 1, wherein: the model builder determines the direct values by calculating potential values for an expansion of an electromagnetic field defined by values at the mesh elements.

6. A system according to claim 1, wherein: the model builder determines the pre-correction values by calculating a spatial-frequency approximation for electromagnetic interactions between nearby mesh-element pairs.

7. A system according to claim 1, wherein: the model builder determines the indirect values by calculating a spatial-frequency approximation for electromagnetic interactions between far-away mesh-element pairs.

8. A system according to claim 1, wherein: the model builder determines the mesh based on a first error criterion for simulating the integrated circuit; and the model
    builder determines the grid based on a second error criterion for modeling electromagnetic interactions between far-away mesh-element pairs.

9. A system according to claim 1, wherein
    the model builder adds values for at least one device model to the device modeling library.

10. A system according to claim 1, further comprising a model operator that is configured for operating the model on layout current values at the mesh elements to determine layout voltage values at the mesh elements, wherein:
    the model operator determines a nearby component for the layout voltage values from the layout current values, the direct values, and the pre-correction values; and
    the model operator determines a far-away component for the layout voltage values from the layout current values and the indirect values.

11. A system according to claim 10, wherein:
    the model operator determines the nearby component for the layout voltage values by calculating a matrix combination of the first-layout current values with the direct values and the pre-correction values.

12. A system according to claim 10, wherein:
    the model operator determines the far-away component for the layout voltage values by projecting values from the mesh to the grid, convolving values on the grid, and interpolating values from the mesh to the grid.

13. A system according to claim 10, further comprising a model solver that is configured for approximating an operating point for the layout by determining operating-point current values that correspond to given operating-point voltage values, wherein the model solver uses the model operator to determines a plurality of layout current values and layout voltage values for calculating the operating-point current values that correspond to the operating-point voltage values.

14. A system according to claim 1, wherein the system includes a computer that is configured to execute computer instructions for building the model.

15. A method for modeling an integrated circuit (IC), comprising:
   specifying a layout for the integrated circuit, the layout including a plurality of devices and a specification of parameters, placement and routing for the devices; and
   building a model for the layout from at least some device models in a device-modeling library; and
   saving at least some values for the model, wherein
      the device-modeling library includes at least one family of device models for modeling devices, each device model including a plurality of mesh elements for modeling devices and a plurality of direct values for modeling impedances for at least some pairs of mesh elements, and
      the model includes: a mesh that includes a plurality of mesh elements for defining values on the mesh, wherein at least some pairs of mesh elements are specified as nearby mesh-element pairs or far-away mesh-element pairs for modeling impedances, a grid that includes a plurality of grid points for defining values on the grid, direct values for modeling impedances at nearby mesh-element pairs of the layout, pre-correction values for modeling impedances at nearby mesh-element pairs of the layout, indirect values for modeling impedances at far-away mesh-element pairs of the layout, projection values for projecting values from the mesh to the grid, and interpolation values for interpolating values from the grid to the mesh.

16. A method according to claim 15, farther comprising:
   operating the model on layout current values at the mesh elements to determine layout voltage values at the mesh elements, wherein operating the model includes:
   determining a nearby component for the layout voltage values from the layout current values, the direct values, and the pre-correction values; and
   determining a far-away component for the layout voltage values from the layout current values and the indirect values.

17. A method according to claim 16, wherein:
   determining the nearby component for the layout voltage values includes calculating a matrix combination of the first-layout current values with the direct values and the pre-correction values.

18. A method according to claim 15, wherein:
   determining the far-away component for the layout voltage values includes projecting values from the mesh to the grid, convolving values on the grid, and interpolating values from the mesh to the grid.

19. A method according to claim 15, farther comprising:
   approximating an operating point for the layout by determining operating-point current values that correspond to given operating-point voltage values, wherein approximating the operating point includes determining a plurality of layout current values and layout voltage values for calculating the operating-point current values that correspond to the operating-point voltage values.

20. A computer-readable medium that stores a computer program for modeling an integrated circuit (IC), wherein the computer program includes instructions for:
   specifying a layout for the integrated circuit, the layout including a plurality of devices and a specification of parameters, placement and routing for the devices; and
   building a model for the layout from at least some device models in a device-modeling library; and
   saving at least some values for the model, wherein
      the device-modeling library includes at least one family of device models for modeling devices, each device model including a plurality of mesh elements for modeling devices and a plurality of direct values for modeling impedances for at least some pairs of mesh elements, and
      the model includes: a mesh that includes a plurality of mesh elements for defining values on the mesh, wherein at least some pairs of mesh elements are specified as nearby mesh- element pairs or far-away mesh-element pairs for modeling impedances, a grid that includes a plurality of grid points for defining values on the grid, direct values for modeling impedances at nearby mesh-element pairs of the layout, pre-correction values for modeling impedances at nearby mesh-element pairs of the layout, indirect values for modeling impedances at far-away mesh-element pairs of the layout, projection values for projecting values from the mesh to the grid, and interpolation values for interpolating values from the grid to the mesh.

21. A computer-readable medium according to claim 20, wherein the computer program further includes instructions for:
   operating the model on layout current values at the mesh elements to determine layout voltage values at the mesh elements, wherein operating the model includes:
   determining a nearby component for the layout voltage values from the layout current values, the direct values, and the pre-correction values; and
   determining a far-away component for the layout voltage values from the layout current values and the indirect values.

22. A computer-readable medium according to claim 21, wherein:
   determining the nearby component for the layout voltage values includes calculating a matrix combination of the first-layout current values with the direct values and the pre-correction values.

23. A computer-readable medium according to claim 20, wherein:
   determining the far-away component for the layout voltage values includes projecting values from the mesh to the grid, convolving values on the grid, and interpolating values from the mesh to the grid.

24. A computer-readable medium according to claim 20, wherein the computer program farther includes instructions for:
   approximating an operating point for the layout by determining operating-point current values that correspond to given operating-point voltage values, wherein approximating the operating point includes determining a plurality of layout current values and layout voltage values for calculating the operating-point current values that correspond to the operating-point voltage values.

* * * * *